(12) United States Patent
Oki et al.

(10) Patent No.: US 6,469,575 B2
(45) Date of Patent: Oct. 22, 2002

(54) CIRCUIT FOR AMPLIFYING AND OUTPUTTING AUDIO SIGNALS

(75) Inventors: Masashi Oki, Tokyo (JP); Kazuhiro Okamoto, Tokyo (JP)

(73) Assignees: Mitsubishi Denki Kabushiki Kaisha, Tokyo (JP); Mitsubishi Electric Engineering Co., Ltd., Tokyo (JP)

( * ) Notice: Subject to any disclaimer, the term of this patent is extended or adjusted under 35 U.S.C. 154(b) by 109 days.

(21) Appl. No.: 09/810,505

(22) Filed: Mar. 19, 2001

(65) Prior Publication Data

US 2001/0010482 A1 Aug. 2, 2001

(30) Foreign Application Priority Data

Dec. 1, 2000 (JP) ........................................ 2000-367683

(51) Int. Cl.$^7$ ................................................. H03F 3/38
(52) U.S. Cl. ........................... 330/10; 330/298; 361/100
(58) Field of Search ............................... 330/10, 207 A, 330/207 P, 251, 298; 361/90, 91, 100

(56) References Cited

U.S. PATENT DOCUMENTS 4,724,396 A * 2/1988 Taylor, Jr. et al. ............ 330/10
5,319,259 A * 6/1994 Merrill ........................ 307/443
5,455,732 A * 10/1995 Davis ........................... 361/90
6,016,075 A * 1/2000 Hamo ........................... 330/10

FOREIGN PATENT DOCUMENTS

| JP | 62-284507 | 12/1987 |
| JP | 62-296608 | 12/1987 |
| JP | 1-129515 | 5/1989 |

* cited by examiner

*Primary Examiner*—Robert Pascal
*Assistant Examiner*—Henry Choe
(74) *Attorney, Agent, or Firm*—Leydig, Voit & Mayer, Ltd.

(57) ABSTRACT

A circuit for amplifying and outputting a pulse width modulated (PWM) signal corresponding to an input audio signal with at least one output transistor and at least one protection control circuit. The protection control circuit compares a detected voltage and a threshold voltage. The detection voltage is a potential difference between a source and a drain of the output transistor. When the detection voltage exceeds the threshold voltage, the protection control circuit outputs a short circuit detection signal to the gate of the output transistor. As a result, the output transistor is turned OFF.

11 Claims, 16 Drawing Sheets

CIRCUIT FOR AMPLIFYING AND OUTPUTTING AUDIO SIGNALS

FIELD OF THE INVENTION

The present invention relates to a circuit, which uses an output transistor, for amplifying and outputting a pulse width modulated (PWM) signal corresponding to an input audio signal. More particularly, this invention relates to a circuit for amplifying and outputting audio signals capable of preventing the output transistor from being thermally destroyed due to an excessively large current due to an output short circuit in a BTL (Balanced Transformer-Less) output circuit such as a class D audio amplifier.

BACKGROUND OF THE INVENTION

FIG. 16 shows a structure of a BTL output section of a conventional class D audio amplifier. FIG. 17 is a timing chart showing operation of the BTL output section. Referring to FIG. 16, a digital audio data D is audio pulse code modulated (PCM) data from a CD, an MD, a DVD, a BS or the like as a signal source. The number of bits and frequency of the data vary depending upon the signal source, but the number of bits is in a range of 14 to 24 bits, and the frequency is in a range of 1 to 4 fs=32 to 192 kHz (1 fs=32 to 48 kHz). For example, in the case of the CD, the number of bits is 16, and the frequency is 1 fs=44.1 kHz.

This digital audio data D is up-sampled by an over sampling digital filter 1, and modulated into 1 bit data strings IN1 and IN2 by a ΣΔ modulator circuit 2 and a PWM pulse generator circuit 3. In order to maintain the audio S/N precision, a period of the PWM pulse is selected in a range of about 1/(16 fs) to 1(64 fs), and the resolving power of the PWM pulse is selected in a range of about 1/(256 fs) to 1/(1024 fs) in many cases.

A signal level of each of the 1 bit data strings IN1 and IN2 output from the PWM pulse generator circuit 3 is about 3 to 5 V, the signal level is driven into about 20 to 50 V by a BTL output driver section 4, and output to LC filters 5a and 5b as amplified and output signals OUT1 and OUT2.

The 1 bit data string IN1 is input to a gate of an output transistor Tr11 as a positive phase input, and input to a gate of an output transistor Tr12 through an inverter I1 as a negative phase input, and output as the amplified and output signal OUT1. Similarly, the 1 bit data string IN2 is input to a gate of an output transistor Tr21 as a positive phase input, and input to a gate of an output transistor Tr22 through an inverter 12 as a negative phase input, and output as the amplified output signal OUT2.

As shown in FIG. 17, in the BTL output, an ON time period "a" of a PWM pulse cycle of the 1 bit data string IN1 and an OFF time period "b" of a PWM pulse cycle of the 1 bit data string IN2 are the same. That is, the data strings IN1 and IN2 have opposite phases, i.e., so-called BTL outputs.

In order to enhance the electric power converting efficiency, it is necessary to reduce the ON resistances of the output transistors Tr11, Tr12, Tr21 and Tr22 which amplify and output the amplified and output signals OUT1 and OUT2. In a normal audio amplifier, the ON resistance is set to 0.3 Ω or less.

The amplified and output signals OUT1 and OUT2 are output to a speaker 10 as analogue signals in which PWM signals represented by the amplified and output signals OUT1 and OUT2 are smoothed through the LC filters 5a and 5b, respectively.

The above-described BTL output section does not have a protection circuit that protects the output from a short circuit. In addition, the speaker 10 has two speaker terminals T1 and T2 which are positive terminals. Therefore, there is a problem in that in the BTL output, an excessively large current may flow at the time of an output short circuit, and the output transistors Tr11, Tr12, Tr21 and Tr22 are then destroyed.

For example, there is an adverse possibility that a user erroneously brings a connection wire into contact with a chassis of the BTL output section or the speaker terminals T1 and T2 are short circuited when the wire of the speaker 10 is connected. In that case, if the speaker terminal T1 is short-circuited with the chassis, i.e., ground (GND), the excessively great current flows when the output transistor Tr11 closer to the power source is ON, and the output transistor Tr11 is destroyed by heat.

Therefore, in some conventional protection circuits, a resistance is inserted in series with the output transistor, an excessively large current is detected from a potential difference between opposite ends of this resistor, and if an excessively large current is detected, the output transistor is turned OFF. However, this protection circuit cannot be applied to the class D amplifier that needs a reduced output resistance.

SUMMARY OF THE INVENTION

It is an object of this invention to provided a circuit for amplifying and outputting audio signals capable of preventing the output transistor from being thermally destroyed due to excessively large current caused by output short circuit in a class D audio amplifier.

The circuit for amplifying and outputting audio signals according to this invention comprises a comparing unit which compares a detection voltage and a predetermined voltage to output a stop signal, and when the detection voltage exceeded the predetermined voltage, outputs a stop signal. The detection voltage here is a potential difference between a source and a drain of the output transistor. The circuit further comprises, a transistor protection control unit which controls to turn OFF an output of the output transistor when the comparing unit output the stop signal.

According to the invention, the comparing unit compares the detection voltage and the predetermined voltage. When the detection voltage exceeded the predetermined voltage, a stop signal is output. When the stop signal is output, the output of the output transistor is turned OFF. Accordingly, flow of excessively large current to the output transistor due to the short circuit of the output can be prevented.

The circuit for amplifying and outputting audio signals may further preferably comprise many output transistors. In such a case, each output transistor is provided with the comparing unit and the transistor protection control unit.

Furthermore, all of the output transistors are turned OFF when the stop signal is output.

Furthermore, it is preferable that the transistor protection control unit comprises a latch circuit which latches the stop signal using the PWM signal as a clock signal, and an AND circuit provided on a gate input side of the output transistor which calculates a logical multiplication of the PWM signal and an inverted signal of the stop signal, and turns the output transistor OFF irrespective of the PWM signal.

Furthermore, it is preferable that the comparing unit comprises a square/divide circuit which outputs a judgment current value obtained by dividing a square value of a detection current value corresponding to the detection voltage and a first bias current value by a second bias current value; and a judging circuit which outputs the stop signal when the judgment current value exceeded a third bias current value.

Furthermore, it is preferable that the circuit for amplifying and outputting audio signals further comprises a first counting unit which counts the number of outputs of the stop signal output from the comparing unit using the PWM as a clock signal, and outputs the stop signal to the transistor protection control unit when the number of output exceeded a first predetermined value, and a second counting unit which counts a clock signal using the PWM signal as the clock signal, and which resets the counting by the second counting unit when the counted number value exceeded a second predetermined value which is greater than the first predetermined value.

Furthermore, it is preferable that the circuit for amplifying and outputting audio signals further comprises a clock generator circuit which generates a clock and outputs the same as a clock signal of the first counting unit and the second counting unit when a pulse width of the PWM signal is equal to or greater than a predetermined width based on the PWM signal and a logical multiplication signal which is a logical multiplication of the PWM signal and a delayed PWM signal which is obtained by delaying the PWM signal, a clock is generated when a pulse width of the PWM signal is equal to or greater than a predetermined width.

Furthermore, it is preferable that the clock generator circuit includes a delay circuit which delays the PWM signal by a gate delay.

Furthermore, it is preferable that the clock generator circuit includes a self-induction oscillator circuit which generates a self-induction oscillated clock, and a shift resistor which delays the PWM signal using the self-induction oscillated clock.

Furthermore, it is preferable that the circuit for amplifying and outputting audio signals further comprises a third counting unit which counts the self-induction oscillated clock or an independent self-induction oscillated clock when the stop signal is output from the comparing unit. The third counting unit outputs the stop signal output to the transistor protection control unit when the counted value exceeded a third predetermined value.

Furthermore, it is preferable that the latch circuit, the second counting unit and the third counting unit reset the latch processing or the counting processing by the release signal input from outside.

Other objects and features of this invention will become apparent from the following description with reference to the accompanying drawings.

DESCRIPTION OF THE PREFERRED EMBODIMENTS

Preferred embodiments of a circuit for amplifying and outputting audio signals of the present invention will be explained below with reference to the accompanying drawings.

Figure 1:
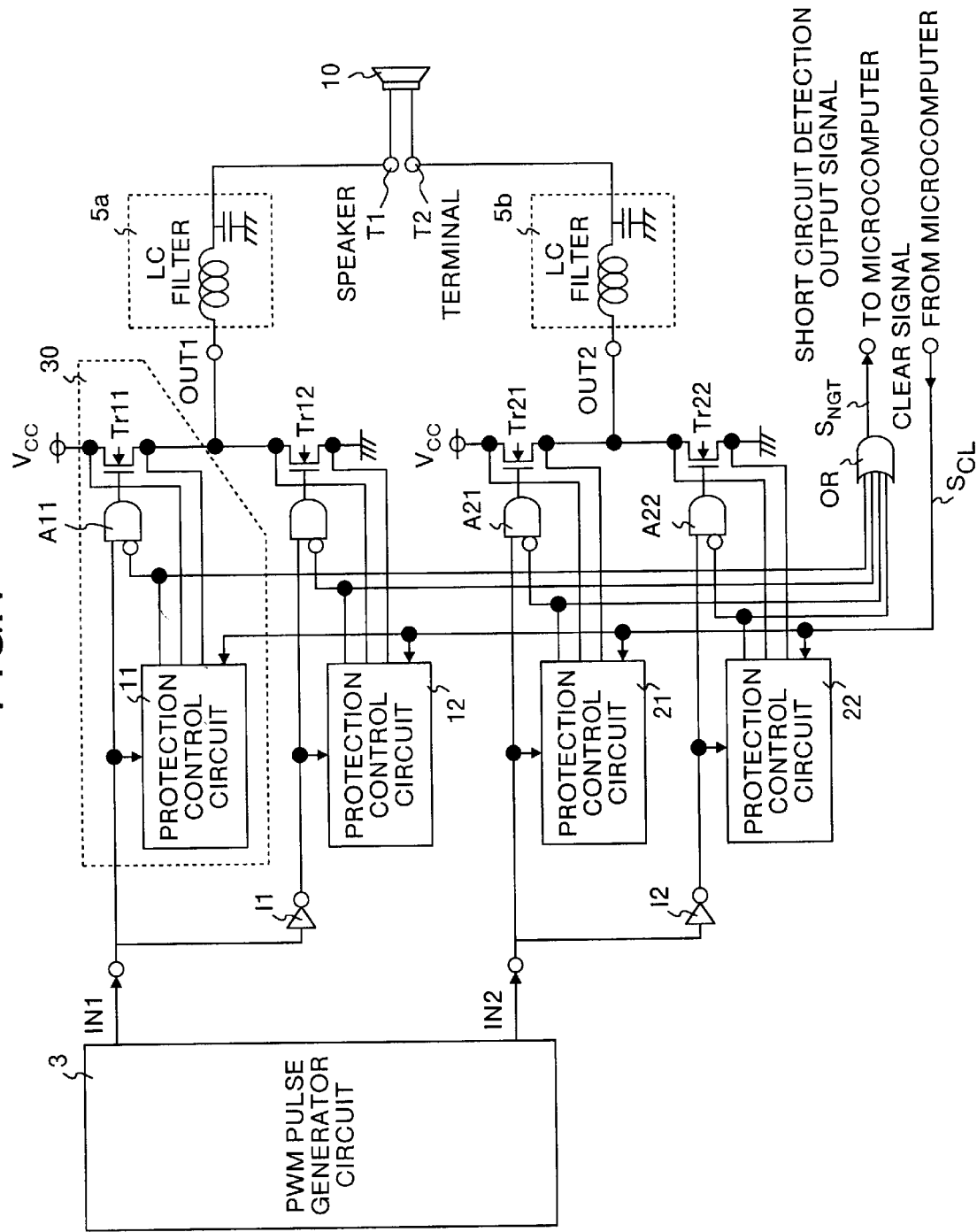
FIG. 1 is a diagram showing an entire structure of a circuit for amplifying and outputting audio signals according to a first embodiment of the present invention.
Figure 16:
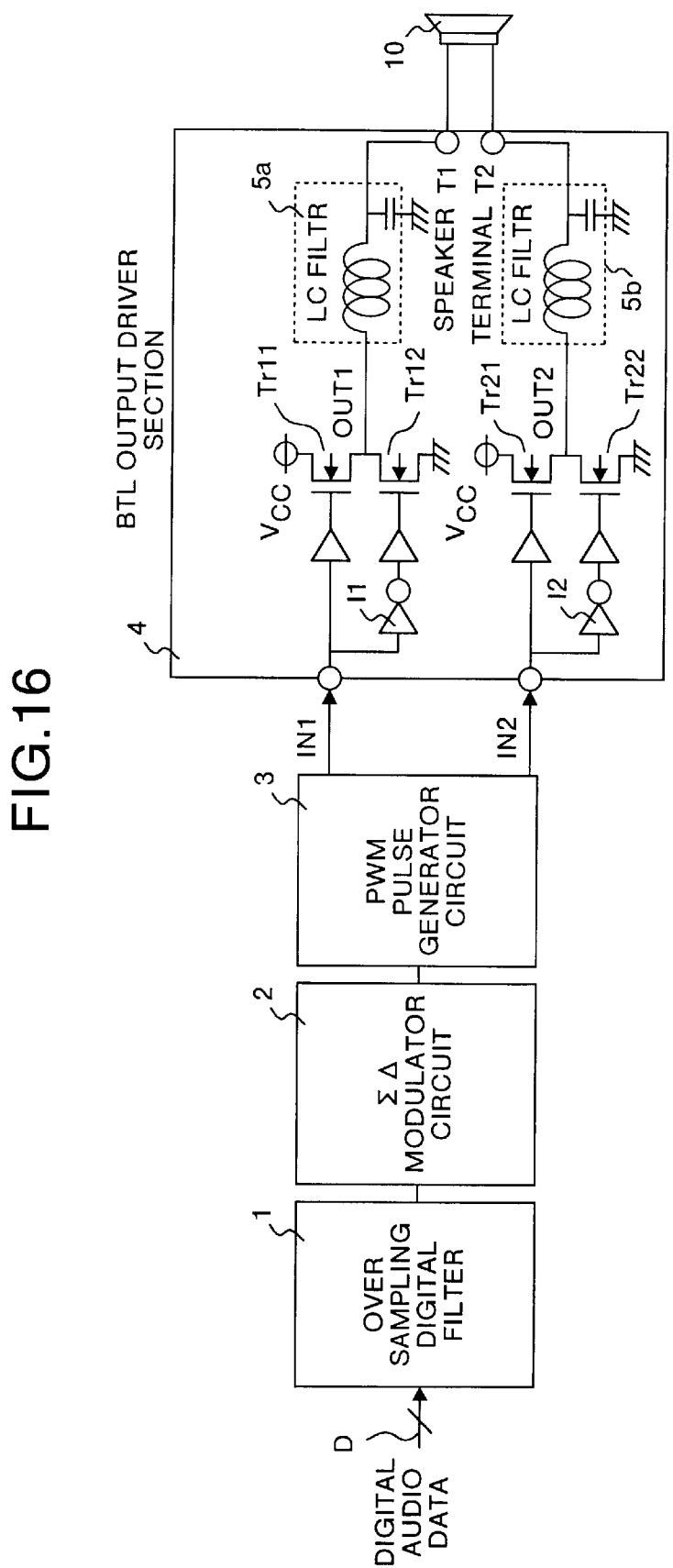
FIG. 16 is a diagram showing an entire structure of a conventional circuit for amplifying and outputting audio signals.

A first embodiment of the invention will be explained now. FIG. 1 is a diagram showing an entire structure of a circuit for amplifying and outputting audio signals according to the first embodiment of the invention. This circuit for amplifying and outputting audio signals corresponds to the BTL output section of the class D audio amplifier shown in FIG. 16. The circuit for amplifying and outputting audio signals includes protection control circuits 11, 12, 21 and 22 respectively corresponding to the output transistors Tr11, Tr12, Tr21 and Tr22, and also includes AND circuits A11, A12, A21 and A22 for outputting short circuit detection signals $S_{NG}$ output from protection control circuits 11, 12, 21 and 22 to gates of the output transistors Tr11, Tr12, Tr21 and Tr22, respectively. Other structures are the same as those of the BTL output section shown in FIG. 16, and the same constituent members are designated with the same symbols.

Figure 2:
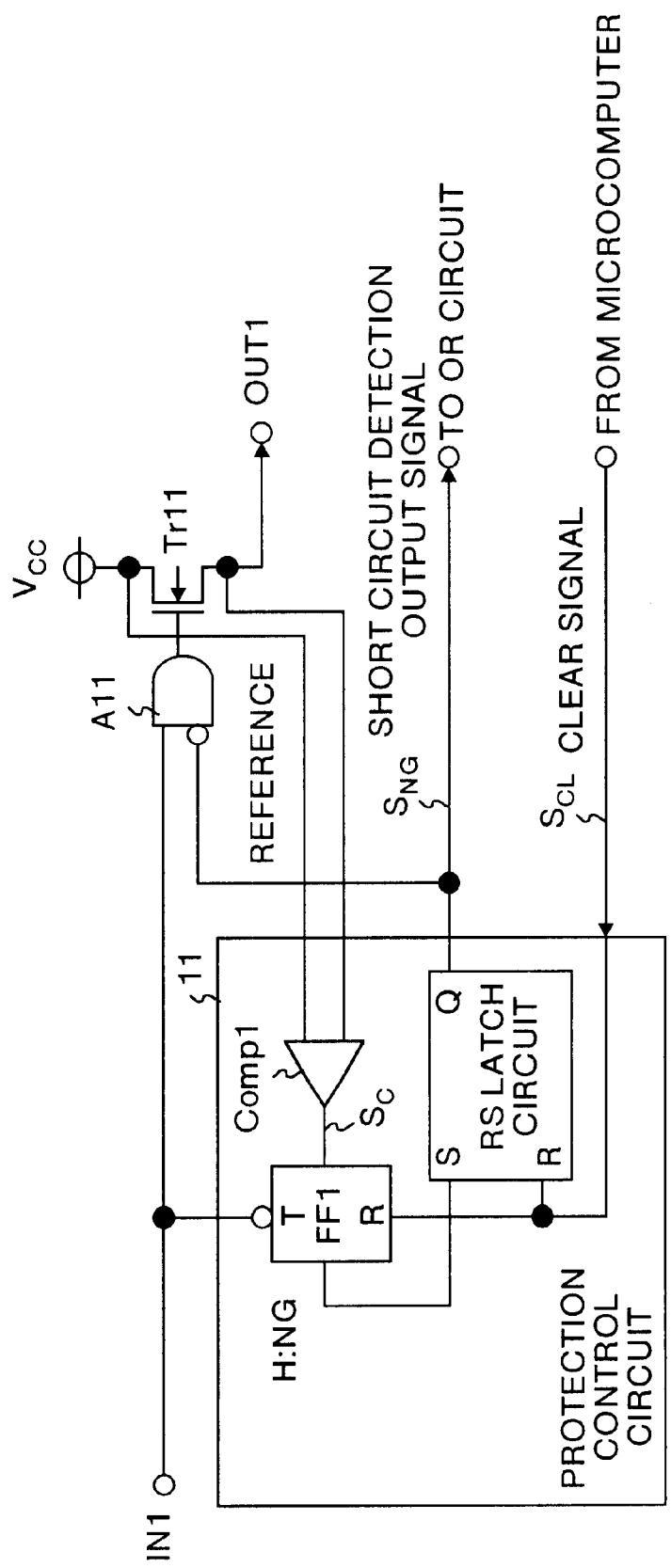
FIG. 2 is a circuit diagram including a protection control circuit shown in FIG. 1.
Figure 3:
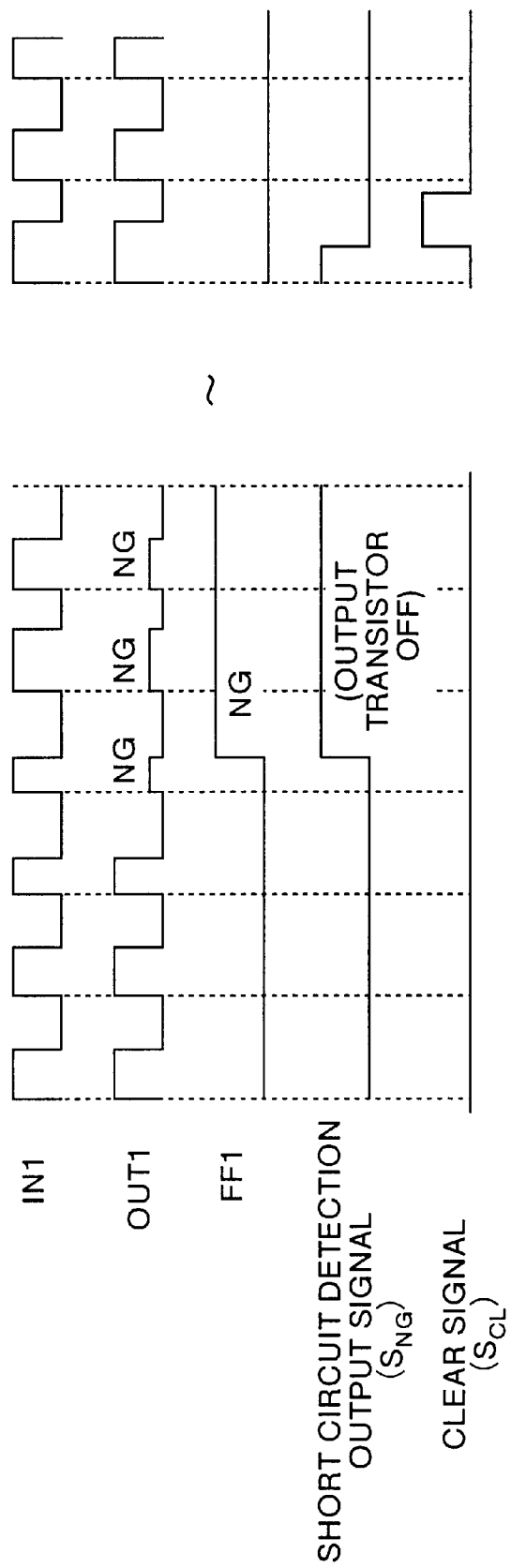
FIG. 3 is a timing chart showing operation of the protection control circuit shown in FIG. 2.

FIG. 2 is a circuit diagram showing a detailed structure of a circuit 30 including a protection control circuit 11, an AND circuit A11 and an output transistor Tr11 shown in FIG. 1. FIG. 3 is a timing chart showing operation of the protection control circuit 11 shown in FIG. 2. In FIG. 2, the protection control circuit 11 includes a comparator Comp1, a flip-flop circuit FF1 and an RS latch circuit 31.

In FIG. 2 and FIG. 3, the comparator Comp1 detects a potential difference between a source and a drain of the output transistor Tr11. If the potential difference exceeds a predetermined voltage, the comparator Comp1 outputs a judgment signal Sc to the flip-flop circuit FF1. The flip-flop circuit FF1 extracts the data string IN1 as a clock, latches the judgment signal Sc with this clock timing, and outputs the same to the RS latch circuit 31. The RS latch circuit 31 also extracts the data string IN1 as a clock, latches the judgment signal Sc input from the flip-flop circuit FF1, and inversely inputs the same to a short circuit output signal $S_{NG}$ to one end of the AND circuit A11. The data string IN1 is input to the other end of the AND circuit A11. The AND circuit A11 outputs AND output of the inverted input of the short circuit output signal $S_{NG}$ and the data string IN1 to a gate of the output transistor Tr11.

Under normal operation, when the data string IN1 is at "H" level, the amplified and output signal OUT1 is at "H" level. Therefore, under the normal operation, the potential difference between the source and the drain of the output transistor Tr11 is small, i.e., smaller than the predetermined voltage and thus, the short circuit output signal $S_{NG}$ of "L" level is output to the flip-flop circuit FF1, the RS latch circuit 31 latches the short circuit output signal $S_{NG}$ of "L" level, and inverted "H" level signal is output to one end of the AND circuit A11. Therefore, a signal corresponding to the data string IN1 is input to the gate of the output transistor Tr11 as it is.

On the other hand, when the amplified and output signal OUT1 is short-circuited with the ground, even if "H" level of the data string IN1 is input to the gate of the output transistor Tr11, the amplified and output signal OUT1 does not rise to the "H" level, and the potential difference is generated between the source and the drain of the output transistor Tr11. Thus, the output (judgment signal Sc) of the comparator Comp1 rises to the "H" level, the flip-flop circuit FF1 latches the "H" level when the data string IN1 falls, the RS latch circuit 31 inversely input the "H" level to the AND circuit A11, and the output transistor Tr11 is turned OFF irrespective of input of the data string IN1.

With the above arrangement, even if the amplified and output signal OUT1 is short-circuited with the ground GND, the excessively large current is prevented from flowing to the output transistor Tr11, and the output transistor Tr11 is not thermally destroyed. As shown in a time point t in FIG. 3, when the output transistor Tr11 is forcibly turned OFF, one time "H" pulse of the data string IN1 flows to the output transistor Tr11, but since the pulse width is small, this is not heated to a temperature at which the output transistor Tr11 is destroyed.

Figure 4:
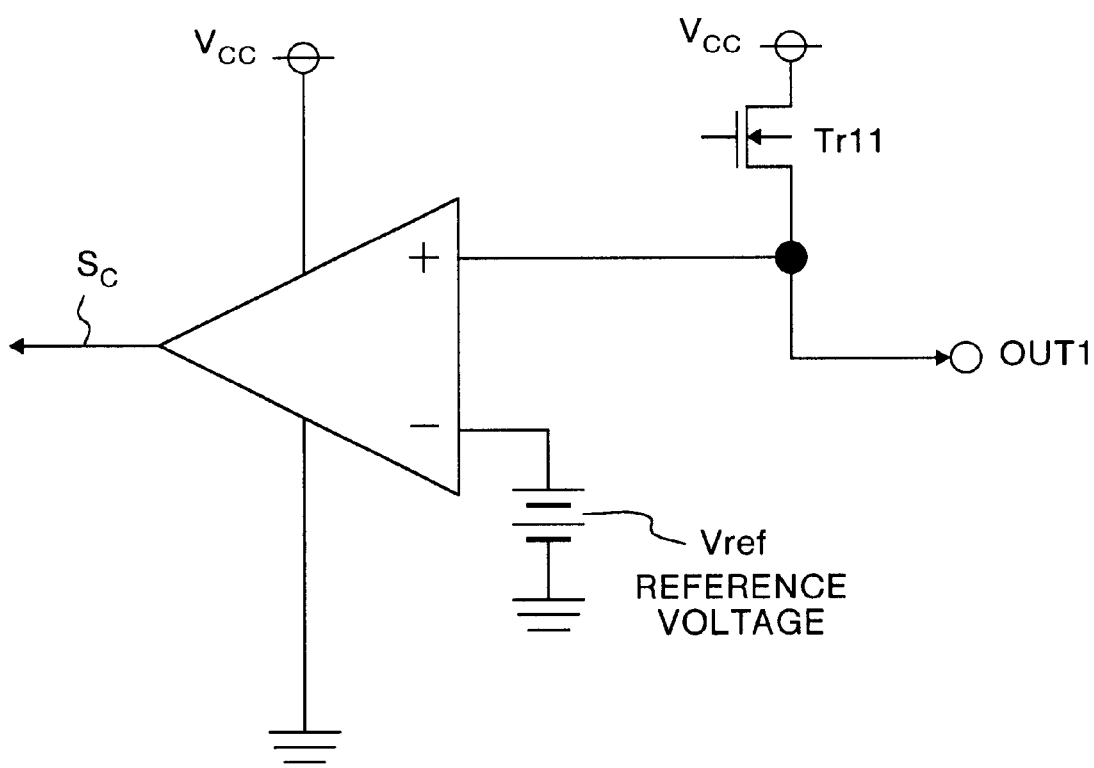
FIG. 4 is a circuit diagram showing one example of a comparator shown in FIG. 2.

The comparator Comp1 can be structured as shown in FIG. 4. That is, it is judged whether drain voltage of the output transistor Tr11 is smaller than a reference voltage Vref, and with this judgment, it is judged whether the potential difference between the source and the drain of the output transistor Tr11 exceeds predetermined voltage.

The short circuit output signal $S_{NG}$ output from each of the protection control circuits 11, 12, 21 and 22 is output to a gate of each of the output transistors Tr11, Tr12, Tr21 and Tr22 through the AND circuits A11, A12, A21 and A22, and the short circuit output signal $S_{NG}$ is output to an external microcomputer (not shown) as one short circuit detection output signal $S_{NGT}$ through a OR circuit OR. When the short circuit detection output signal $S_{NGT}$ is at "H" level, the microcomputer (not shown) carries out indicator display to inform the user of abnormal state of the output short circuit. After the user eliminated a cause of the output short circuit, if user gives predetermined instructions to turn on the microcomputer (not shown), the microcomputer (not shown) executes the initial resetting. At that time, the microcomputer outputs a clear signal $S_{CL}$ to each of the protection control circuits 11, 12, 21 and 22, and the microcomputer returns into its normal operational state by the resetting processing.

The short circuit between the speaker terminal T1 and the ground GND is detected by the protection control circuit 11 in this manner, and the output transistor Tr11 is protected against thermal destruction. Similarly, the short circuit between the speaker terminal T1 and the power source Vcc is detected by the protection control circuit 12, and the output transistor Tr12 is protected against the thermal destruction. The short circuit between the speaker terminal T2 and the power source Vcc is detected by the protection control circuit 21, and the output transistor Tr21 is protected against the thermal destruction. Further, the short circuit between the speaker terminal T2 and the ground GND is detected by the protection control circuit 22, and the output transistor Tr22 is protected against the thermal destruction. The short circuit between the speaker terminals T1 and T2 is detected by the protection control circuits 11, 12, 21 and 22, and the output transistors Tr11, Tr12, Tr21 and Tr22 are protected against the thermal destruction.

In the first embodiment, when each of the output transistors Tr11, Tr12, Tr21 and Tr22 is ON, if the potential difference between the source and the drain of each of the output transistors Tr11, Tr12, Tr21 and Tr22 exceeds the predetermined voltage, i.e., the potential difference does not become small, the protection control circuits 11, 12, 21 and 22 judge that abnormal excessively large current flows, and the protection control circuits 11, 12, 21 and 22 control to turn OFF the corresponding output transistors Tr11, Tr12, Tr21 and Tr22 so as to protect the output transistors Tr11, Tr12, Tr21 and Tr22 from thermal destruction.

Figure 5:
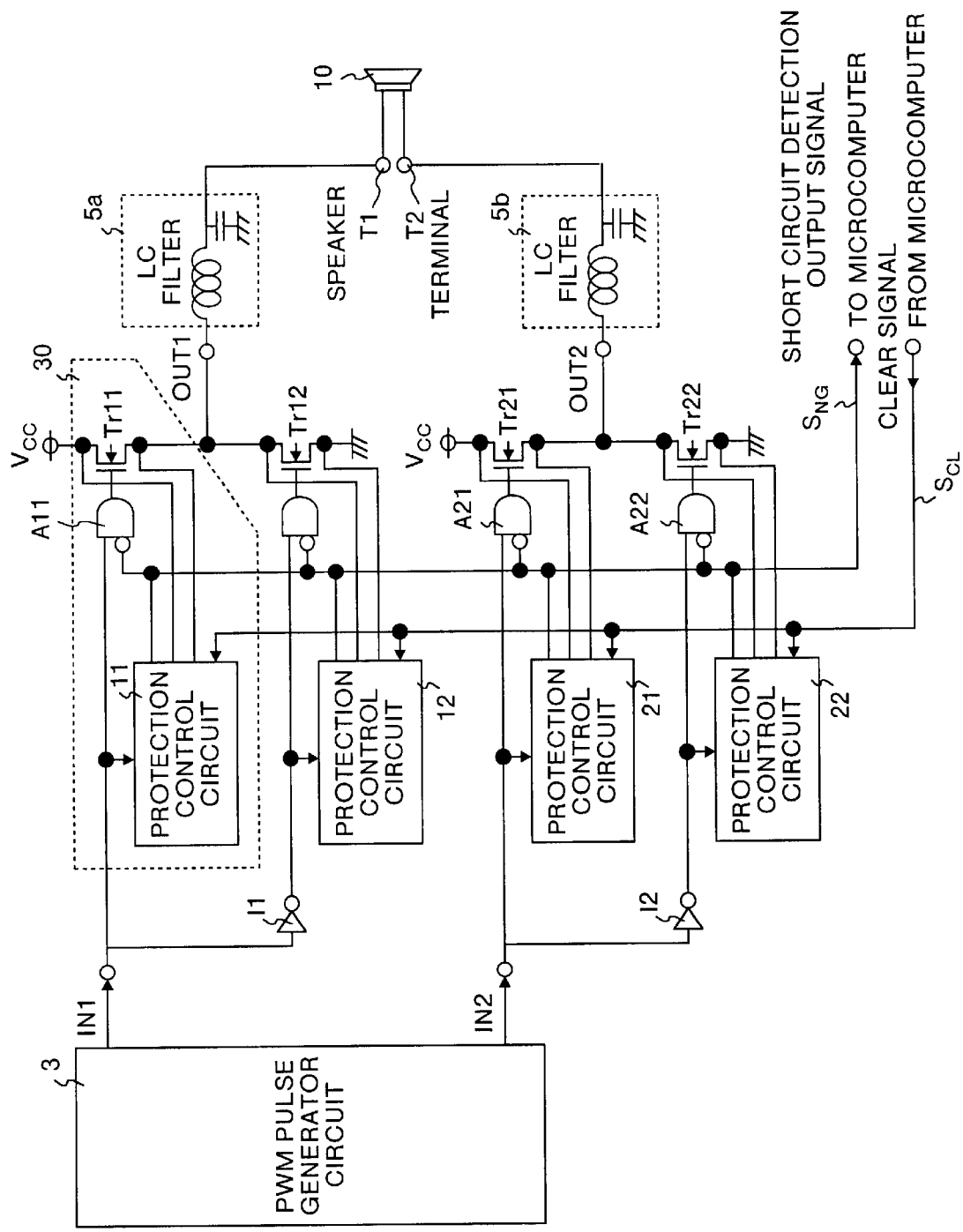
FIG. 5 is a diagram showing a structure of a modification of the circuit for amplifying and outputting audio signals shown in FIG. 1.

In the above first embodiment, the protection control circuits 11, 12, 21 and 22 and the output transistors Tr11, Tr12, Tr21 and Tr22 are controlled correspondingly, but the invention is not limited to this. For example, as shown in FIG. 5, when one of the protection control circuits detected abnormality such as excessively large current, the protection control circuit may output the short circuit output signal $S_{NG}$ to all of the output transistors to turn OFF all the output transistor. For example, the short circuit output signal $S_{NG}$ output from the protection control circuit 11 may be input to an inverse input terminal of each of the AND circuits A11, A12, A21 and A22 to control to turn OFF all the output transistors Tr11, Tr12, Tr21 and Tr22.

Next, a second embodiment of the invention will be explained. In the second embodiment, a structure of the comparator Comp1 used in the first embodiment is enhanced. In the case of the comparator Comp1 shown in FIG. 4, when excessively large current flows between the source and the drain of the output transistor Tr1 due to the abnormal state such as the output short circuit, it is necessary to swiftly detect this abnormal state, to output the short circuit output signal $S_{NG}$, and to turn OFF the output transistor Tr11, and the high speed operation of the comparator Comp1 is required.

Figure 6:
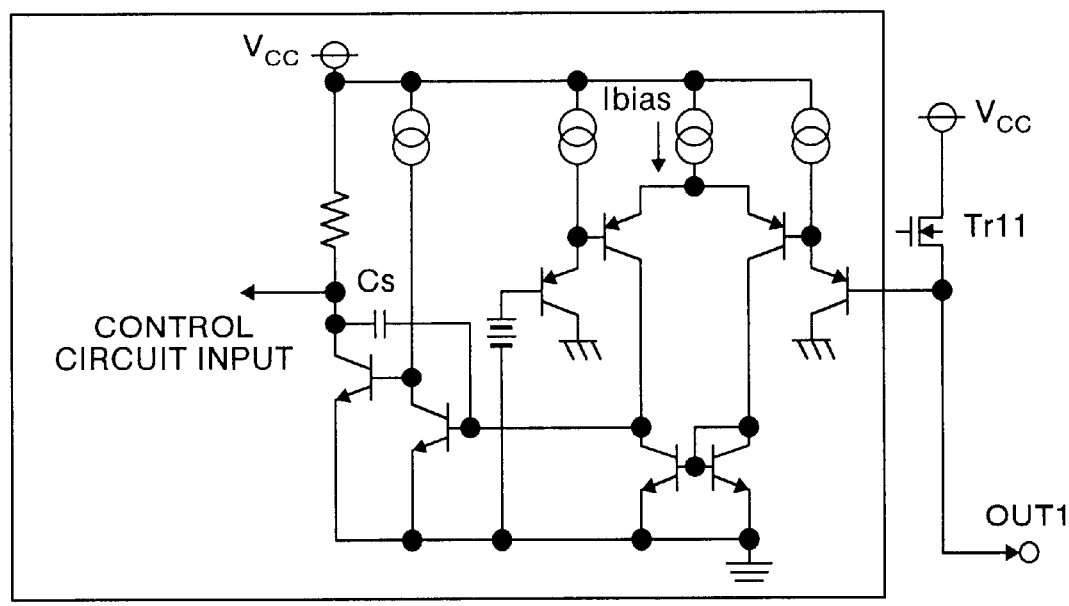
FIG. 6 is a circuit diagram showing a detailed structure of the comparator shown in FIG. 2.

FIG. 6 shows a structure of a general comparator used in the comparator Comp1 of the first embodiment. In order to allow the comparator shown in FIG. 6 to operate at high speed, it is necessary to make a through rate RS determined by the following equation fast:

$$RS = I\text{bias}/Cs$$

Here, "Ibias" is a bias current, and "Cs" is parasitic capacity. Therefore, in order to make the through rate fast, it is necessary to increase the bias current Ibias. Thus, in the case of the comparator shown in FIG. 6, it is necessary to always flow the bias current Ibias, and as the circuit current and circuit are increased, the internal transistor must be increased in size.

Figure 7:
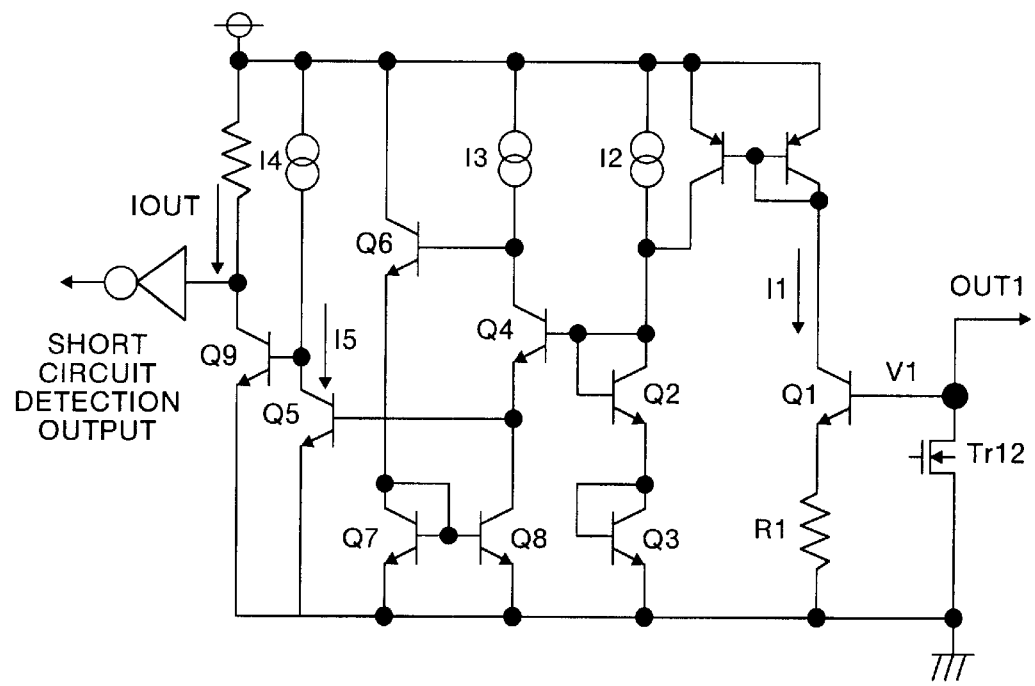
FIG. 7 is a circuit diagram showing a structure of one example of a comparator of a circuit for amplifying and outputting audio signals according to a second embodiment of the invention.
Figure 8:
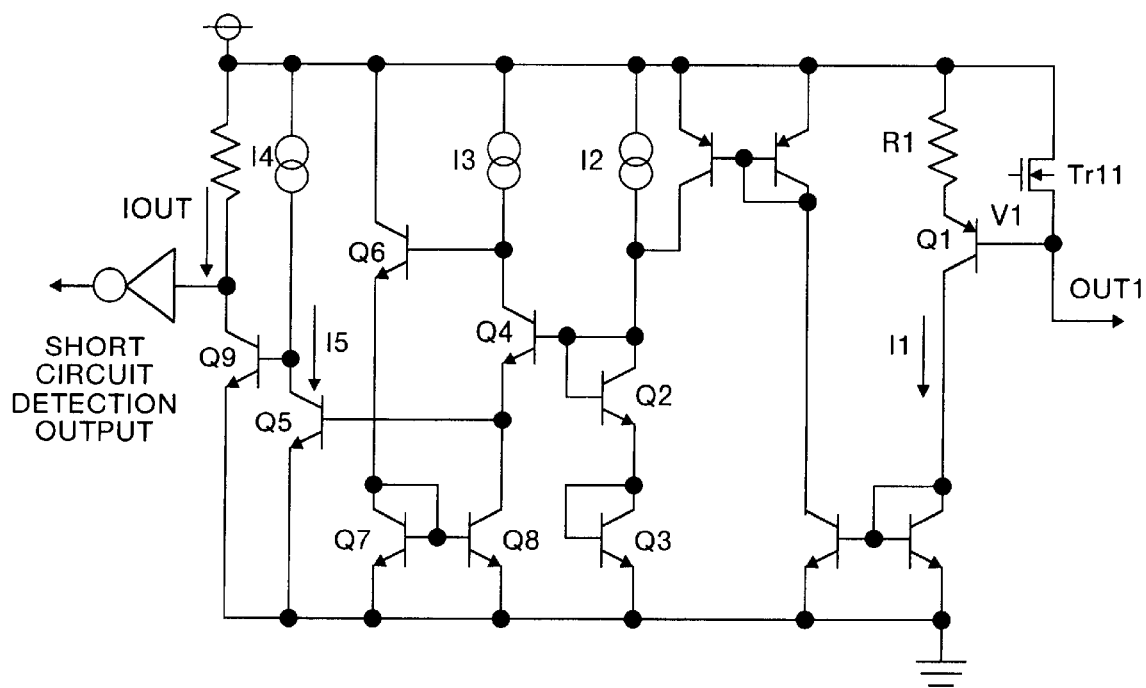
FIG. 8 is a circuit diagram showing a structure of one example of the comparator of the circuit for amplifying and outputting audio signals according to the second embodiment of the invention.

Thereupon, FIG. 7 and FIG. 8 show a structure of the comparator in which the bias current is small under normal conditions, and only when abnormal state is generated, i.e., only when the excessively great current flows, the bias current is increased so that the high speed operation can be carried out. FIG. 7 is a circuit diagram showing the structure of the comparator Comp1 in the protection control circuit 12 for controlling the output transistor Tr12 for "L" output voltage, and FIG. 8 is a circuit diagram showing the structure of the comparator Comp1 in the protection control circuit 11 for controlling the output transistor Tr11 for "H" output voltage.

In FIG. 7 and FIG. 8, when excessively great current flows through the output transistors Tr11 and Tr12 due to abnormal condition, the ON voltage of the output transistors Tr11 and Tr12 rise, and current I1 shown with the following equation is output from a collector of a transistor Q1:

$$I1=(V1-VBEQ1)/R1$$

Here, "V1" is voltage applied to a base of the transistor Q1 from a drain of each of the output transistors Tr11 and Tr12. "VBEQ1" is voltage between the base and an emitter of the transistor Q1. "R1" is a resistance directly connected to the emitter of the transistor Q1.

Transistors Q2, Q3, Q4 and Q5 constitute a square/divide circuit, and output the output current I5 shown below from a transistor Q5.

$$I5=(I1+I2)^2/I3$$

Here, "I2" and "I3" are bias currents.

The output current IOUT is controlled by the potential difference between the bias current I4 and the output current I5. When abnormal condition due to the excessively great current of the output transistors Tr11 and Tr12 is detected, the output current I5 is increased as compared with the bias current I4, the base current of the transistor Q9 is pulled, "L" level as output of the comparator, and "H" level judgment signal Sc is output by the inverter.

The above-described square/divide circuit will be explained. First, voltage between the base and emitter and current between the collector and the emitter of each of the transistors Q2 to Q5 has a relation shown with the following equations:

$$VBEQ2+VBEQ3=VBEQ4+VBEQ5$$

$$ICQ2 \times ICQ3 = ICQ4+ICQ5$$

$$ICQ2=ICQ3=I1+I2$$

$$ICQ3=I3$$

thus, $$ICQ5(IOUT)=(I1+I2)^2/I3$$

Negative feedback is applied to the base of the transistor Q6→the emitter of the transistor Q6→the base of the transistor Q7, the collector→the base of the transistor Q8→the collector of the transistor Q8→the emitter of the transistor Q4→the collector of the transistor Q4. Thus, ICQ4=I3.

In the second embodiment, the same current as that of a normal comparator which is required to be operated at high speed when the abnormal condition is detected, but such abnormal condition is not detected, only small bias current I2 to I4 flows. Therefore, the circuit current is small, the output state of output current IOUT can be controlled by a resistance R1 and current I1 and I4 and thus, it is easy to protect and control the circuit, and the circuit can be set flexibly.

Figure 9:
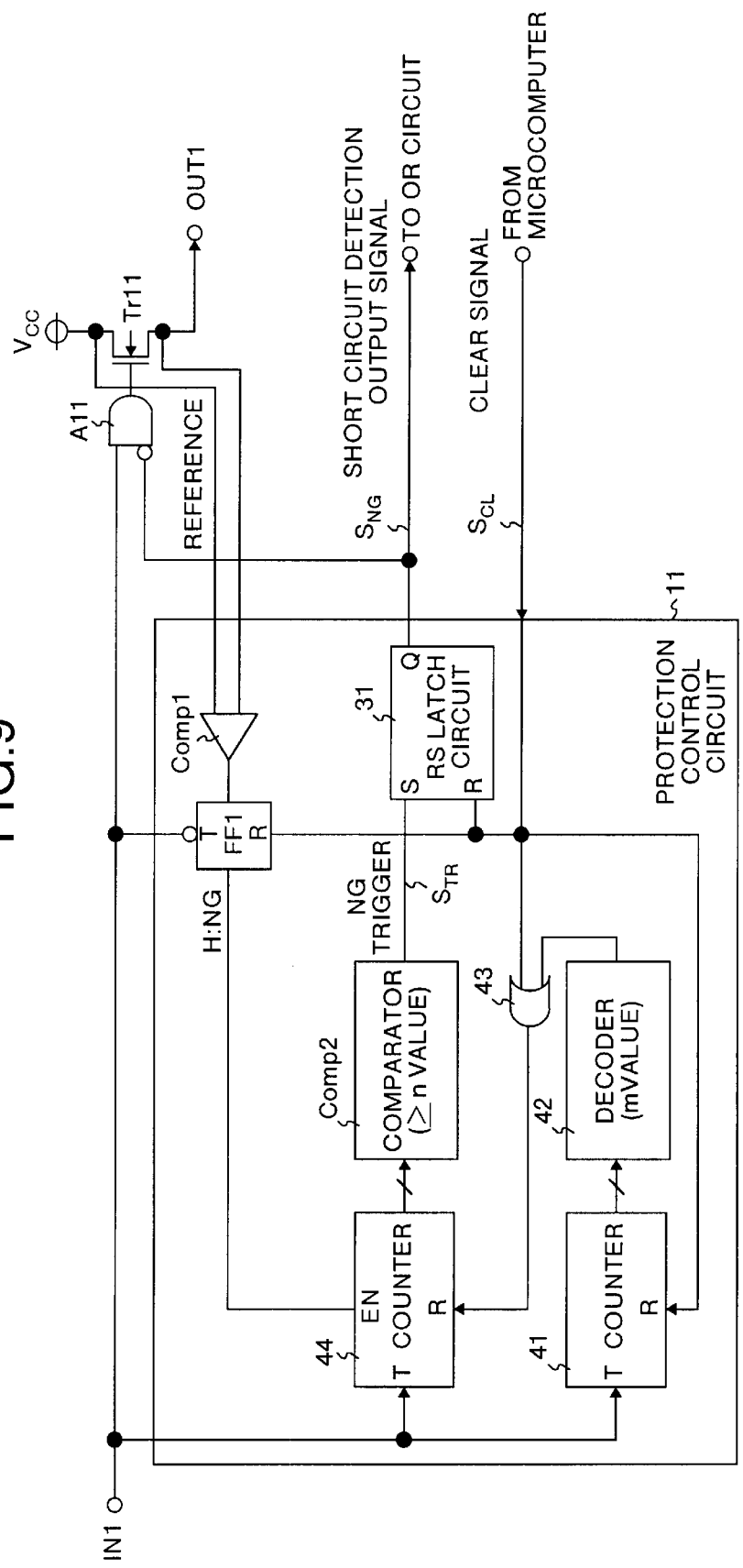
FIG. 9 is a diagram showing a structure of a protection control circuit of a circuit for amplifying and outputting audio signals according to a third embodiment of the invention.
Figure 10:
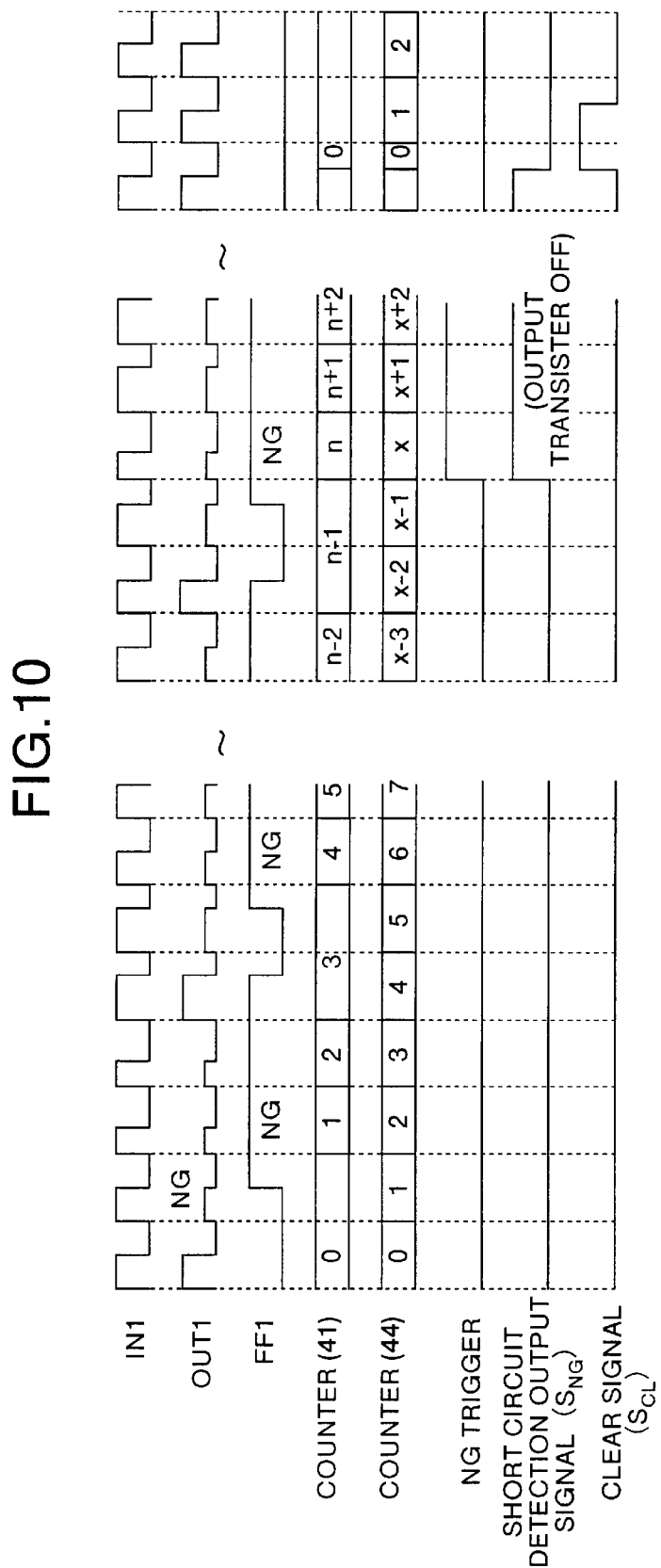
FIG. 10 is a timing chart showing operation of the protection control circuit shown in FIG. 9.

Next, a third embodiment of the invention will be explained. FIG. 9 shows a structure of a protection control circuit of a circuit for amplifying and outputting audio signals according to the third embodiment of the invention. FIG. 10 is a timing chart showing operation of the protection control circuit shown in FIG. 9.

In FIG. 9, this protection control circuit 11 includes a counter 41, a decoder 42, an OR circuit 43, a counter 44 and a comparator Comp2. Other structures are the same as those of the first embodiment, and the same constituent members are designated with the same symbols.

As shown in FIG. 10, the counter 41 counts up the number of detection by rising edge of the data string IN1 using the data string IN1 as a clock. The decoder 42 decodes the count result of the counter 41, and when the decode value reached a predetermined detection number "m", the decoder 42 resets the counter 44 through the OR circuit 43. The counter 44 counts the number of which the judgment signal Sc latched by the flip-flop circuit FF1 is "H" level signal (NG signal). The comparator Comp2 outputs NG trigger to an RS latch circuit when the number of NG signals counted by the counter 44 reaches a predetermined number "n" ("n" is a value equal to or smaller than "m"). The RS latch circuit 31 outputs the short circuit output signal $S_{NG}$ which turns the output transistor Tr11 OFF.

That is, the counter 44 detected the number of the NG signals n-times or more while the counter 41 detected m-times, it is judged that the output was short-circuited, and the NG trigger is output to the RS latch circuit 31. In other words, when a ratio of the number of detection of the NG signal by the counter 44 to the number of detection by the counter 41 becomes equal to or greater than "n/m", it is judged that the output was short-circuited.

The clear signal $S_{CL}$ from the microcomputer (not shown) is input to the counter 41, and is also input to the counter 44 through the OR circuit 43, and is reset.

In the third embodiment, the timing for turning the output transistor Tr11 OFF is delayed by time of m-clocks of the data string IN1 at maximum. During this maximum m-clock time period, the excessively great current flows to the output transistor Tr11, but even if the excessively great current flows during this time period, the m value is set to such a value that the output transistor Tr11 is not thermally destroyed.

Figure 17:
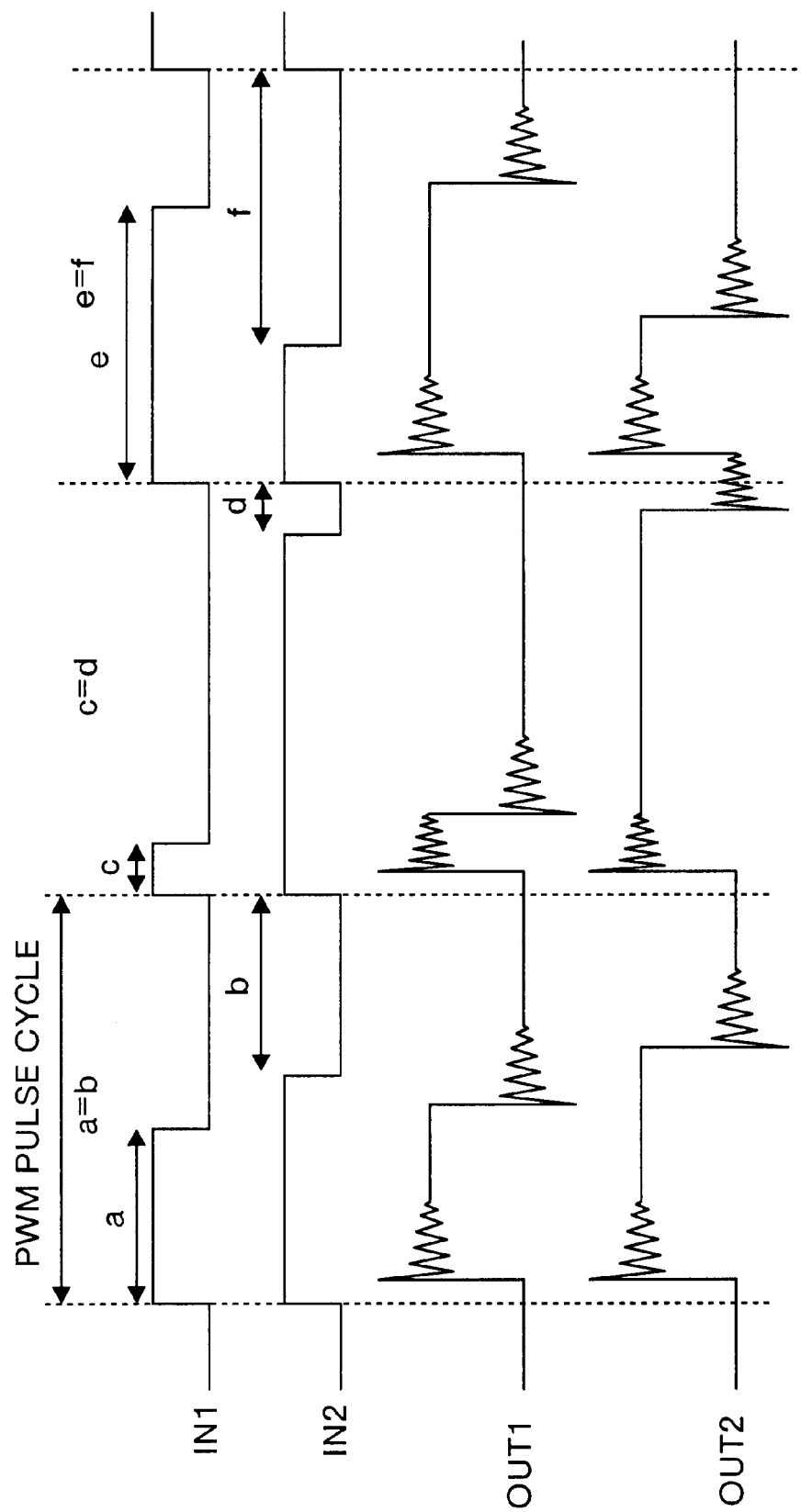
FIG. 17 is a timing chart showing one example of a 1 bit data string and an amplified and output signal output from a PWM pulse generator circuit shown in FIG. 16.

According to the third embodiment, the malfunction for frequently turning the output transistor OFF can be prevented by detecting the number of NG signals detected by the comparator Comp1. That is, as shown in FIG. 17, since overshoot or undershoot is generated in the amplified and output signals OUT1 and OUT2 from the output transistors Tr11, Tr12, Tr21 and Tr22 due to abrupt change of output level, there is a possibility that the NG signals may be erroneously detected frequently, but in the third embodiment, since it is judged that the output is short-circuited when the number of detection of the NG signal becomes equal to or greater than the predetermined ratio, it is possible to judge the output short circuit reliably.

Figure 11:
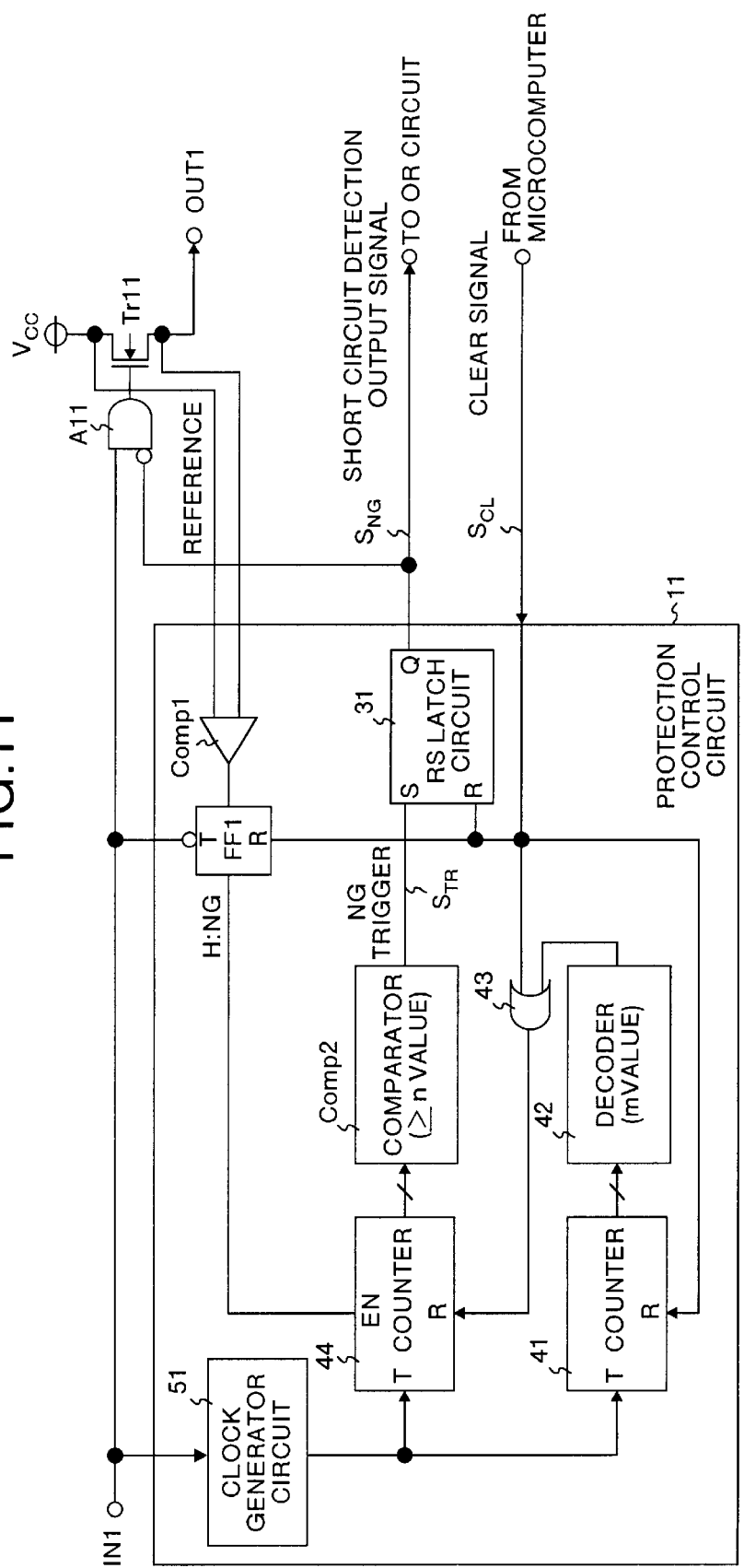
FIG. 11 is a diagram showing a structure of a protection control circuit of a circuit for amplifying and outputting audio signals according to a fourth embodiment of the invention.

Next, a fourth embodiment of the invention will be explained. FIG. 11 is a diagram showing a structure of a protection control circuit of a circuit for amplifying and outputting audio signals according to the fourth embodiment of the invention. In this protection control circuit 11, a clock generator circuit 51 is mounted to the protection control circuit shown in the third embodiment in FIG. 9. Other structures are the same as those of the third embodiment, and the same constituent members are designated with the same symbols. The clock generator circuit 51 uses the data string IN1 as a clock, generates a clock from when the pulse width of the PWM signal of the data string IN1 is equal to or smaller than a predetermined width, and output the clock as clock for the counters 41 and 44.

Figure 12:
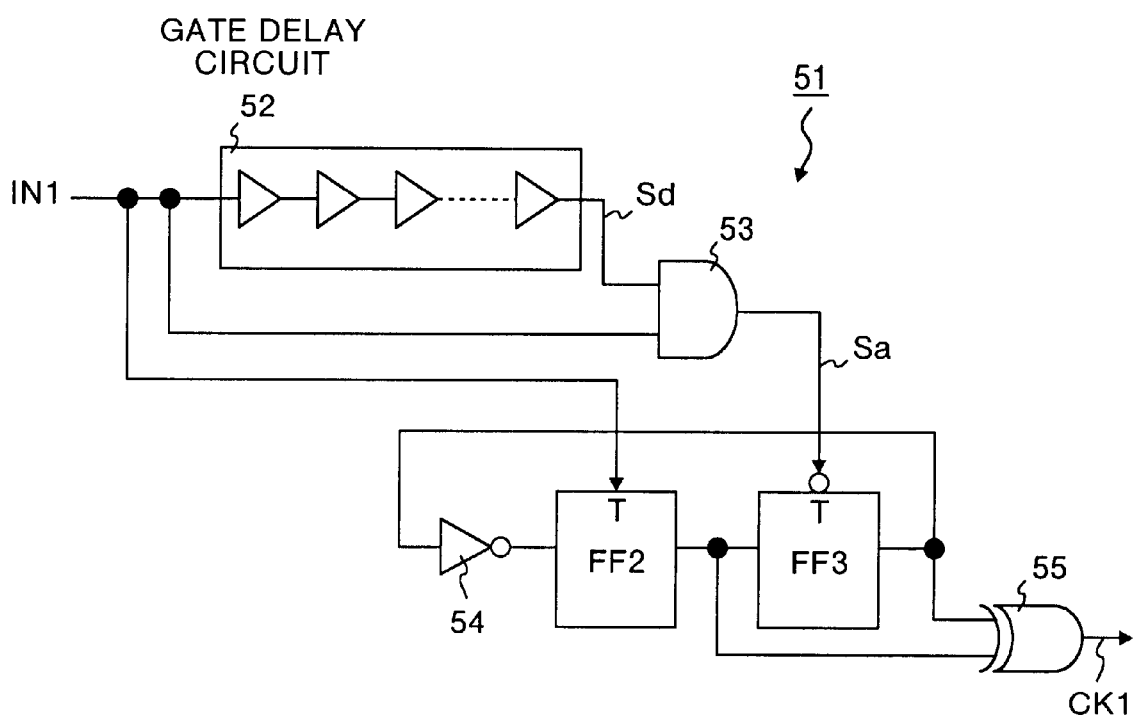
FIG. 12 is a circuit diagram showing a detailed structure of a clock generator circuit shown in FIG. 11.
Figure 13:
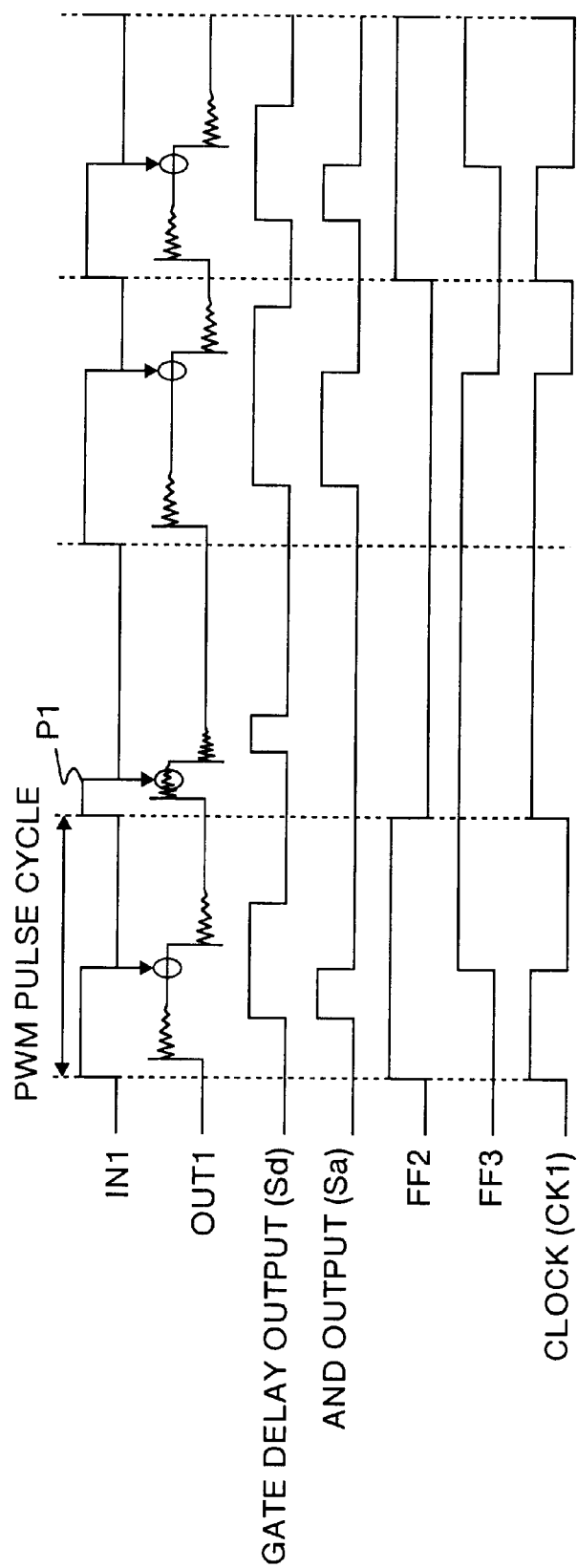
FIG. 13 is a flowchart showing operation of the clock generator circuit shown in FIG. 11.

FIG. 12 is a block diagram showing a detailed structure of the clock generator circuit 51, and FIG. 13 is a timing chart showing operation of the clock generator circuit 51. The clock generator circuit 51 shown in FIG. 12 uses a gate delay circuit 52 to generate a clock which was deleted when the pulse width of the PWM signal is equal to or less than a predetermined width.

The data string IN1 is input to one ends of the gate delay circuit 52 and an AND circuit 53, and is input to the flip-flop circuit FF2 as clock. A gate delay signal Sd which was gate-delayed by the gate delay circuit 52 is output to the other end of the AND circuit 53. The output of the AND circuit 53 is inversely input to a flip-flop circuit FF3 as a clock. The output of the flip-flop circuit FF3 is fedback and output to the flip-flop circuit FF2 through an inverter 54, and output to one end of an XOR circuit 55. The output of the flip-flop circuit FF2 is output to the other end of the XOR circuit 55. The XOR circuit 55 outputs a clock CK1 which is exclusive OR of the output of the flip-flop circuit FF3 and the flip-flop circuit FF2 as a clock of the counters 41 and 44.

As shown in FIG. 13, if the pulse width is short like the pulse P1 of the data string IN1, when the judgment signal Sc of the comparator Comp1 is taken into the flip-flop circuit FF1 with a falling timing of the pulse P1, a voltage value is taken in a state in which the overshoot or undershoot period of the amplified and output signal OUT1 is unstable. As a result, the comparator Comp1 output erroneous judging result. Therefore, as shown in FIG. 13, the clock generator circuit 51 outputs the clock CK1 which does not output a clock caused by falling down of the pulse P1 having small pulse width as a clock.

The AND circuit 53 outputs a superposed portion between a "H" level of the original data string IN1 and a "H" level of a pulse which was gate-delayed and which is output from the gate delay circuit 52 as a "H" level. Therefore, in the case of the pulse P1 having small pulse width as compared with the gate delay time period, the "H" level signal is not output from the AND circuit 53 and as a result, the XOR circuit 55 does not generate a clock corresponding to this pulse P1, and the clocks are thinned out.

With this arrangement, it is possible to reduce the probability of erroneous detection of the comparator Comp1 and as a result, it is possible to judge the output short circuit reliably and stably.

Next, a fifth embodiment of the invention will be explained. In the above fourth embodiment, the data string IN1 is delayed using the gate delay circuit 52. In the fifth embodiment, the data string IN1 is delayed using a shift resistor.

Figure 14:
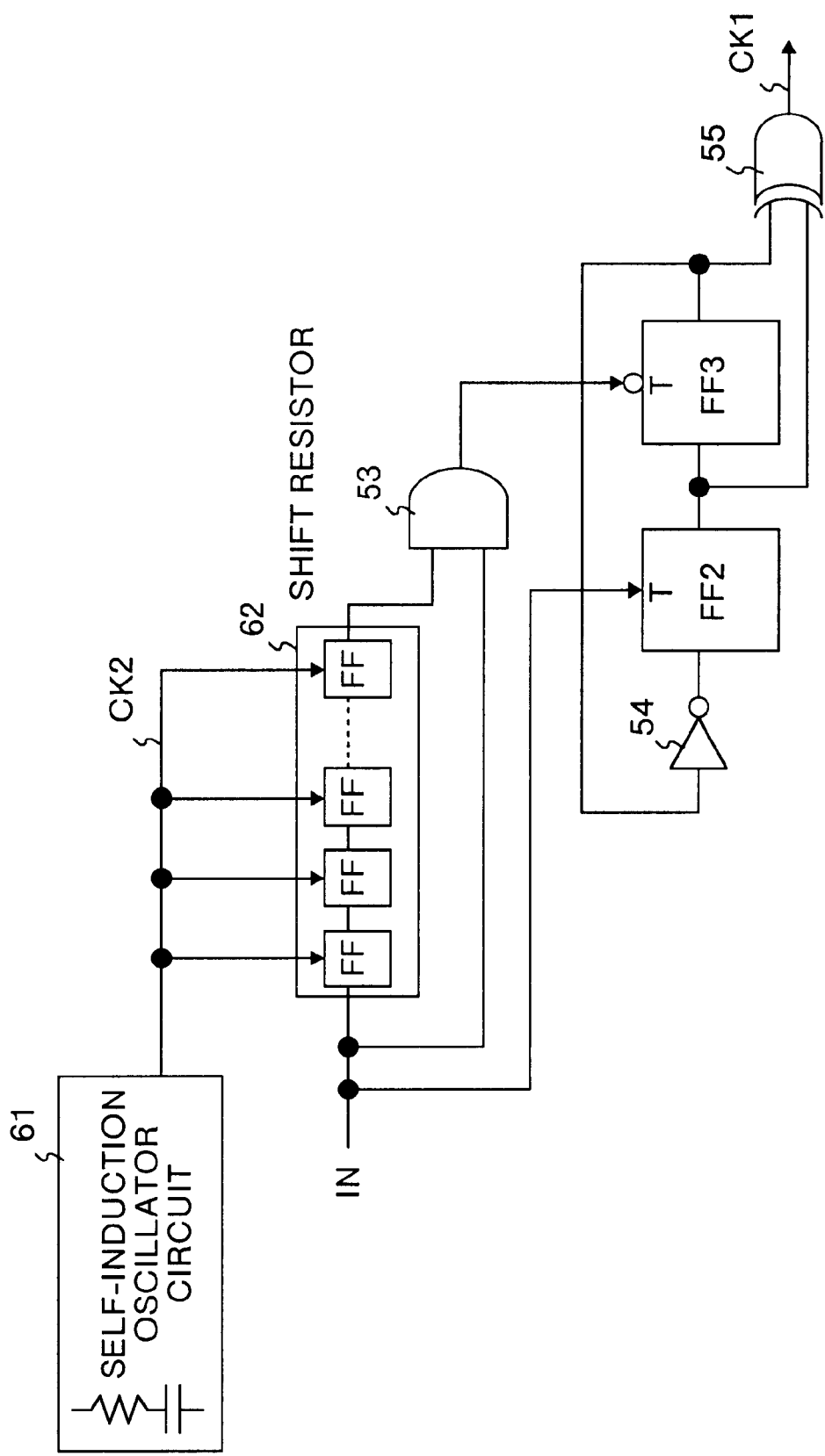
FIG. 14 is a circuit diagram showing a structure of a clock generator circuit of a circuit for amplifying and outputting audio signals according to a fifth embodiment of the invention.

FIG. 14 is a circuit diagram showing a structure of a clock generator circuit of a circuit for amplifying and outputting audio signals according to the fifth embodiment of the invention. This clock generator circuit includes a shift resistor 62 instead of the gate delay circuit 52 shown in FIG. 12, and further includes a self-induction oscillator circuit 61 for driving this shift resistor 62. Other structures are the same as those of the fourth embodiment, and the same constituent members are designated with the same symbols.

In FIG. 14, the shift resistor 62 shifts the input data string IN1, thereby outputting the same to the AND circuit 53 with delay, based on a clock CK2 oscillated and output from the self-induction oscillator circuit 61. With this arrangement, the clock CK1 from which clock generation due to pulse P1 having small pulse width is deleted is output to the counters 41 and 44 as same as the fourth embodiment.

In generally, in the case of the gate delay circuit 52 of the fourth embodiment, the delay is varied due to variation of the semiconductor process, and the pulse width value of the data string IN1 to be deleted is also varied. In the fifth embodiment, since the data string IN1 is delayed by the shift resistor 62 using the self-induction and oscillated clock CK2, the delay is less prone to be affected by the variation in the semiconductor process, stable delay can be obtained, and the variation of the pulse width to be deleted finally can be restrained. Although the clock CK2 is output by the self-induction oscillator circuit 61 in the above fifth embodiment, the present invention is not limited to the self-induction oscillator circuit.

Sixth Embodiment

Next, a sixth embodiment will be explained. The above first to fifth embodiments are based on a precondition that the data string IN1 is input to the output transistor Tr1. In the sixth embodiment, when a signal of the data string IN1 is not input to the output transistor Tr1, i.e., when the signal is at "H" level or "L" level, the output transistor Tr1 is prevented from being thermally destroyed even the output is short-circuited.

Figure 15:
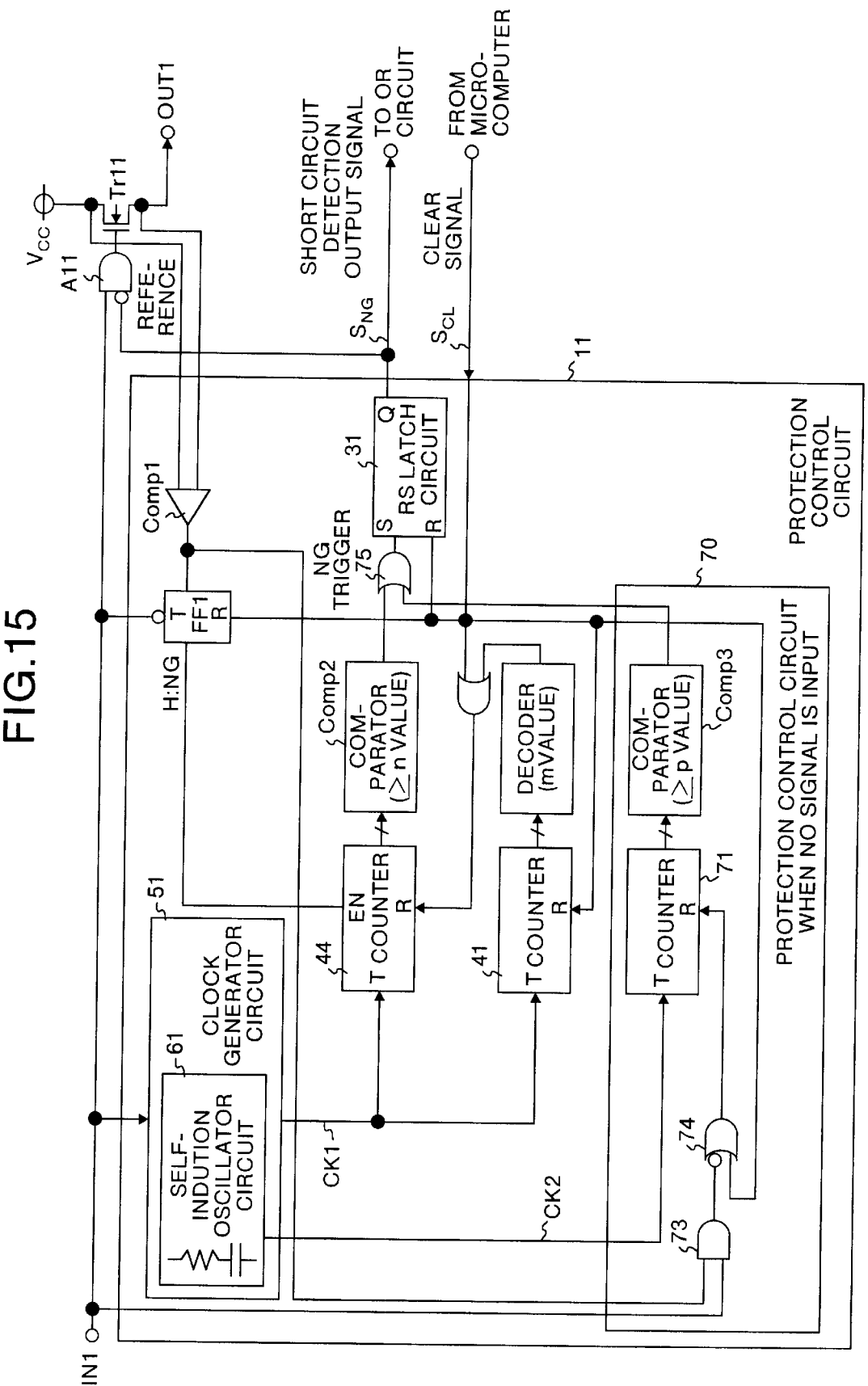
FIG. 15 is a diagram showing a structure of a circuit for amplifying and outputting audio signals according to a sixth embodiment of the invention.

FIG. 15 is a diagram showing a structure of a circuit for amplifying and outputting audio signals according to the sixth embodiment of the invention. In the protection control circuit shown in FIG. 15, a no-signal-time protection control circuit 70 is provided in the protection control circuit 11 shown in the fifth embodiment. Other structures are the same as those of the fifth embodiment, and the same constituent members are designated with the same symbols.

The no-signal-time protection control circuit 70 includes a counter 71, a comparator Comp3, an AND circuit 73 and an OR circuit 74. An output of the comparator Comp1 is input to one end of the AND circuit 73, and the data string IN1 is input to the other end. An inverted output of the AND circuit 73 and a clear signal $S_{CL}$ from the microcomputer (not shown) are input to the OR circuit 74. An output of the OR circuit 74 is input to a reset end of the counter 71. Normally, when the output is not short-circuited, and when the level is "H" level constantly or "L" level constantly at which the data string IN1 is not input, the output of the AND circuit 73 is "L" level. Normally, since this inverted output, i.e., the "H" level output or the clear signal $S_{CL}$ ("H" level) is input, the counter 71 is always in a reset state, and the count up is not carried out.

The counter 71 counts up the clock CK2 of the self-induction oscillator circuit 61 when the input signal is at "H" level constantly and the output of the comparator Comp1 becomes "H" level and the output short circuit is detected. That is, the counter 71 counts up the clock CK2 of the self-induction oscillator circuit 61 when the AND circuit 73 output the "H" level, and the "L" level which is the inverted output is input to the reset end of the counter 71 through the OR circuit 74 and with this, the reset of the counter 71 is released.

If the reset of the counter 71 is released, the counter 71 counts the clock output from the self-induction oscillator circuit 61, and when the counted results exceeded a predetermined value "p", it is judged that the output was short-circuited, and the NG trigger is output to the RS latch circuit 31 through the OR circuit 75.

The sixth embodiment is an example of the protection control circuit on the side of the power source when the input signal is "H" level constantly. When the input signal is at the "L" level constantly, the output short circuit when no signal is input can be protected by the protection control circuit on the side of the ground.

Although the clock CK2 output from the self-induction oscillator circuit 61 shown in the fifth embodiment is counted up in the above sixth embodiment, the invention is not limited to this. Another self-induction oscillator circuit may be separately provided, and the clock from this self-induction oscillator circuit may be counted up. In this case, the first and third embodiments can appropriately be combined.

In the sixth embodiment, even when no signal is input to the gate terminal of the output transistor, i.e., even when the output is short-circuited when the signal is at "H" level constantly or "L" level constantly, the output short circuit can be reliably be detected to protect the circuit.

As described above, according to the present invention, the comparing unit compares the predetermined voltage with the detection voltage which is the potential difference between the source and the drain of the output transistor, and the detection voltage exceeded the predetermined voltage, the stop signal is output, and when the comparing unit output the stop signal, the transistor protection control unit turns OFF the output of the output transistor so that the excessively great current does not flow to the output transistor due to the short circuit of the output. Therefore, there is effect that it is possible to reduce the ON resistance of the output transistor, and to prevent the output transistor from being thermally destroyed due to the excessively great current flowing to the output transistor.

Furthermore, many output transistors are provided, and each of the output transistors is provided with the comparing unit and the transistor protection control unit, and they prevent the excessively great current from flowing to the output transistors due to the short circuit of output. Therefore, there is effect that it is possible to reliably prevent the output transistor used in the entire circuit for amplifying and outputting audio signals from being thermally destroyed.

Furthermore, the transistor protection control unit controls to turn all of the plurality of output transistors OFF when the comparing unit output the stop signal. Therefore, there is effect that it is possible to reliably prevent the output transistor from being thermally destroyed.

Furthermore, the latch circuit of the transistor protection control unit latches the stop signal using the PWM signal as the clock signal, and the AND circuit provided on the gate input side of the output transistor which calculates the logical multiplication of the PWM signal and an inverted signal of the stop signal, and turns the output transistor OFF irrespective of the PWM signal. Therefore, there is effect that it is possible to reliably prevent the output transistor from being thermally destroyed.

Furthermore, the square/divide circuit outputs the judgment current value obtained by dividing the square value of a detection current value corresponding to the detection voltage and the first bias current value by the second bias current value, and the judging circuit outputs the stop signal when the judgment current value exceeded the third bias current value, thereby restraining the bias current value flowing at normal time. Therefore, there is effect that it is possible to reduce the size of the circuit and power consumption, and to judge the state flexibly.

Furthermore, the first counting unit counts the number of outputs of the stop signal output from the comparing unit using the PWM as a clock signal, and outputs the stop signal to the transistor protection control unit when the number of output exceeded a first predetermined value, and the second counting unit counts the clock signal using the PWM signal as the clock signal, and resets the counted number by the second counting unit when the counted number value exceeded the second predetermined value which is greater than the first predetermined value, so that the short circuit of the output is detected in accordance with a ratio of the first predetermined value/second predetermined value. Therefore, there is effect that it is possible to reduce the probability of erroneous judgment of the short circuit of the output generated due to overshoot or undershoot caused by abrupt variation in output level of the output transistor, and to judge the short circuit of output reliably.

Furthermore, the clock generator circuit generates a clock and outputs the same as a clock signal of the first counting unit and the second counting unit when abuse width of the PWM signal is equal to or greater than a predetermined width based on the PWM signal and a logical multiplication signal which is a logical multiplication of the PWM signal and a delayed PWM signal which is obtained by delaying the PWM signal, the clock is generated when the pulse width of the PWM signal is equal to or greater than a predetermined width, so that the generation of the clock due to the pulse having the pulse width of smaller than the predetermined width is thinner out, and the output short circuit is not judged in an unstable state which is generated by overshoot and undershoot generated by abrupt variation of the output level of the output transistor. Therefore, there is effect that it is possible to judge the short circuit of the output reliably and stably.

Furthermore, the clock generator circuit includes the delay circuit which delays the PWM signal by a gate delay, and clocks of pulse having pulse width smaller than the predetermined width using this delayed delay PWM signal. Therefore, there is effect that it is possible to judge the short circuit of the output reliably and stably with a simple structure.

Furthermore, the shift resistor delays the PWM signal using the self-induction oscillated clock output from the self-induction oscillator circuit. Therefore, there is effect that it is possible to judge the short circuit of the output more reliably and stably.

Furthermore, third counting unit counts the self-induction oscillated clock or the independent self-induction oscillated clock when the stop signal is output from the comparing unit, and the third counting unit outputs the stop signal output to the transistor protection control unit when the counted value exceeded the third predetermined value, so that even if no signal is input, the short circuit of output is detected to turn OFF the output transistor. Therefore, there is effect that it is possible to reliably prevent the output transistor from being thermally destroyed even if the gate input of the output transistor is in a no signal state.

Furthermore, the latch circuit, the second counting unit or the third counting unit resets the latching processing or the counting processing by the release signal input from outside, thereby returning to the state into normal state. Therefore, there is effect that it is possible to return the state into a normal operational state reliably and swiftly.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A circuit for amplifying and outputting a pulse width modulated (PWM) signal corresponding to an input audio signal, said circuit comprising:

an output transistor having a source, a gate, and a drain;

a comparing unit which compares a detection voltage, which detection voltage is a potential difference between the source and the drain of said output transistor, and a threshold voltage, and outputs a stop signal when the detection voltage exceeds the threshold voltage; and a transistor protection control unit which turns OFF said output transistor when said comparing unit outputs the stop signal.

2. The circuit according to claim 1, including a plurality of said output transistors, wherein each output transistor is connected to said comparing unit and said transistor protection control unit.

3. The circuit according to claim 2, wherein said transistor protection control unit turns OFF all of said output transistors when said comparing unit outputs the stop signal.

4. The circuit according to claim 1, wherein said transistor protection control unit includes:

a latch circuit which latches the stop signal using the PWM signal as a clock signal; and an AND circuit provided on a gate input side of said output transistor which calculates a logical multiplication of the PWM signal and an inverted signal of the stop signal, and turns OFF said output transistor irrespective of the PWM signal.

5. The circuit according to claim 1, wherein said comparing unit includes:

a square/divide circuit which outputs a judgment current value obtained by dividing a square of a sum of a detection current corresponding to the detection voltage and a first bias current by a second bias current; and a judging circuit which outputs the stop signal when the judgment current exceeds a third bias current.

6. The circuit according to claim 1, further comprising:

a first counting unit which counts the number of outputs of the stop signal from said comparing unit using the PWM signal as a clock signal, and outputs the stop signal to said transistor protection control unit when the count exceeds a first count value; and a second counting unit which counts a clock signal using the PWM signal as the clock signal, and which resets counting by said second counting unit when the count of said second counting unit exceeds a second count value which is greater than the first count value.

7. The circuit according to claim 6, further comprising a clock generator circuit which generates a clock and outputs the clock as a clock signal of said first and second counting units when a pulse width of the PWM signal is at least equal to a first width, based on the PWM signal and a logical product signal which is a logical multiplication of the PWM signal and a delayed PWM signal obtained by delaying the PWM signal, a clock being generated when a pulse width of the PWM signal is at least equal to a second width.

8. The circuit according to claim 7, wherein said clock generator circuit includes a delay circuit which delays the PWM signal by a gate delay.

9. The circuit according to claim 7, wherein said clock generator circuit includes, a self-induction oscillator circuit which generates a self-induction oscillated clock; and a shift resistor which delays the PWM signal using the self-induction oscillated clock.

10. The circuit according to claim 1, further comprising a third counting unit which counts the self-induction oscillator clock or an independent self-induction oscillator clock when the stop signal is output from said comparing unit, wherein said third counting unit outputs the stop signal output to said transistor protection control unit when a count of said third counting unit exceeds a third value.

11. The circuit according to claim 1, wherein said latch circuit, said second counting unit, and said third counting unit reset latch processing or counting based on a received release signal.

* * * * *